(12) United States Patent
Balakrishnan et al.

(10) Patent No.: US 9,490,156 B2
(45) Date of Patent: Nov. 8, 2016

(54) TRANSFER DEVICE FOR HOLDING AN OBJECT USING A GAS FLOW

(71) Applicants: Sathish Kumar Balakrishnan, Singapore (SG); Kumaresh Govindan Radhakrishnan, Singapore (SG); Wen Ge Tu, Singapore (SG); HongLiang Lu, Singapore (SG); Lian Hok Tan, Singapore (SG)

(72) Inventors: Sathish Kumar Balakrishnan, Singapore (SG); Kumaresh Govindan Radhakrishnan, Singapore (SG); Wen Ge Tu, Singapore (SG); HongLiang Lu, Singapore (SG); Lian Hok Tan, Singapore (SG)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 24 days.

(21) Appl. No.: 14/279,699

(22) Filed: May 16, 2014

(65) Prior Publication Data

US 2014/0348624 A1 Nov. 27, 2014

Related U.S. Application Data

(60) Provisional application No. 61/826,719, filed on May 23, 2013.

(51) Int. Cl.

| | |
|---|---|
| *H01L 21/683* | (2006.01) |
| *B25B 11/00* | (2006.01) |
| *B25J 15/00* | (2006.01) |
| *B65G 47/91* | (2006.01) |

(52) U.S. Cl.
CPC ......... *H01L 21/6838* (2013.01); *B25B 11/005* (2013.01); *B25J 15/0023* (2013.01); *B65G 47/911* (2013.01)

(58) Field of Classification Search
CPC ............ B25J 15/0023; B25J 15/0052; B65G 47/911; H01L 21/6838; B25B 11/005
See application file for complete search history.

(56) References Cited

U.S. PATENT DOCUMENTS

| | | | | |
|---|---|---|---|---|
| 3,438,668 A | * | 4/1969 | Williams | ............... B66C 1/0212 294/64.3 |
| 3,523,706 A | * | 8/1970 | Logue | ................. H01L 21/6838 294/64.3 |
| 4,034,977 A | * | 7/1977 | Jahn | .................... G03G 15/6532 271/310 |
| 4,474,397 A | * | 10/1984 | Hassan | ............... H01L 21/6838 294/64.3 |
| 5,080,549 A | * | 1/1992 | Goodwin | ............. B25J 15/0616 414/744.8 |
| 2008/0292446 A1 | * | 11/2008 | Caldwell | ............. H01L 21/6838 414/785 |

FOREIGN PATENT DOCUMENTS

JP 2011156654 A * 8/2011

* cited by examiner

*Primary Examiner* — Gerald McClain
(74) *Attorney, Agent, or Firm* — Ostrolenk Faber LLP

(57) ABSTRACT

A transfer device for holding an object comprises: i) a housing; ii) at least one inlet conduit having an inlet for gas; iii) a plurality of sets of outlet conduits, each set of outlet conduits being in fluid communication with the at least one inlet conduit and having a plurality of outlets for directing the gas out of the outlet conduits. The respective outlets of the sets of outlet conduits are arranged in a direction along the housing surface and away from a center region relative to the respective sets of outlet conduits, so that a laminar gas flow that flows along the housing surface generates a pressure differential which creates a force towards the center region to hold the object against the housing surface.

9 Claims, 9 Drawing Sheets

TRANSFER DEVICE FOR HOLDING AN OBJECT USING A GAS FLOW

FIELD OF THIS INVENTION

This invention relates to a transfer device for holding an object, such as a solar wafer and/or a solar cell, using a gas flow.

Description of the Prior Art

FIG. 1 shows a conventional apparatus 100 for holding an object 102 using a gas flow to create a pressure differential. The apparatus 100 comprises i) a housing 104 with a housing surface 106 against which the object 102 rests; and ii) three sets 108a, 108b, 108c of gas outlets arranged on the housing surface 106. In particular, these sets 108a, 108b, 108c of gas outlets are connected to respective conduits 110 that run inside the housing 104. In turn, these conduits 110 are connected to a compressed gas pump (not shown) to introduce a gas into the housing 104, and subsequently, out of the housing 104 through the sets 108a, 108b, 108c of gas outlets. When the gas is expelled from within the housing 104, a gas that flows along the housing surface 106 forms a pressure differential which thereby provides a force to hold the object 102 against the housing surface 106.

Due to the triangular arrangement of the sets 108a, 108b, 108c of gas outlets, there is a presence of gas turbulence at a centre region relative to the sets 108a, 108b, 108c of gas outlets when the gas exits from within the apparatus 100. This creates a positive pressure differential at the centre region, which creates a force that pushes the object 102 in a direction away from the housing surface 106. Accordingly, the object 102 may bend while being held by the apparatus 100. Further, such an arrangement of the sets of the gas outlets 108a, 108b, 108c also reduces the effectiveness of the apparatus 100 in holding the object 102 for transfer between locations.

It is, therefore, an object of the present invention to seek to ameliorate the above drawbacks of the conventional apparatus 100, and to provide the general public with a useful choice.

SUMMARY OF THE INVENTION

A first aspect of the invention is a transfer device for holding an object. The transfer device comprises: i) a housing having a housing surface; ii) at least one inlet conduit having an inlet for introducing a gas into the at least one inlet conduit; and iii) a plurality of sets of outlet conduits, each set of outlet conduits being in fluid communication with the at least one inlet conduit and having a plurality of outlets for directing the gas out of the housing, In particular, the outlets of the respective sets of outlet conduits are arranged in a direction along the housing surface and away from a centre region relative to the respective sets of outlet conduits, so that a laminar gas flow that is flows along the housing surface generates a pressure differential which creates a force towards the centre region to hold the object against the housing surface.

A second aspect of the invention is a gang picker comprising: i) a manifold having at least one manifold inlet for introducing a gas into the manifold and a plurality of manifold outlets for directing the gas out of the manifold, and ii) a plurality of the transfer devices according to the first aspect of the invention. In particular, the manifold outlets are connected to respective inlets of the inlet conduits of the transfer devices, so that the gas that is directed out of the manifold subsequently flows into the respective inlet conduits of the transfer devices.

BRIEF DESCRIPTION OF THE DRAWINGS

Embodiments of this invention will now be described, by way of example only, with reference to the accompanying drawings, of which:

FIG. 2a shows a transfer device according to a first preferred embodiment of the present invention, while FIG. 2b shows a side view of the transfer device as illustrated in FIG. 2a;

FIG. 3a and FIG. 3b show different cross-sectional views of the transfer device of FIG. 2a;

FIGS. 5a and 5b are perspective views of a gang picker, comprising multiple transfer devices of FIG. 4, while

DETAILED DESCRIPTION OF THE PREFERRED EMBODIMENTS

Figure 1:
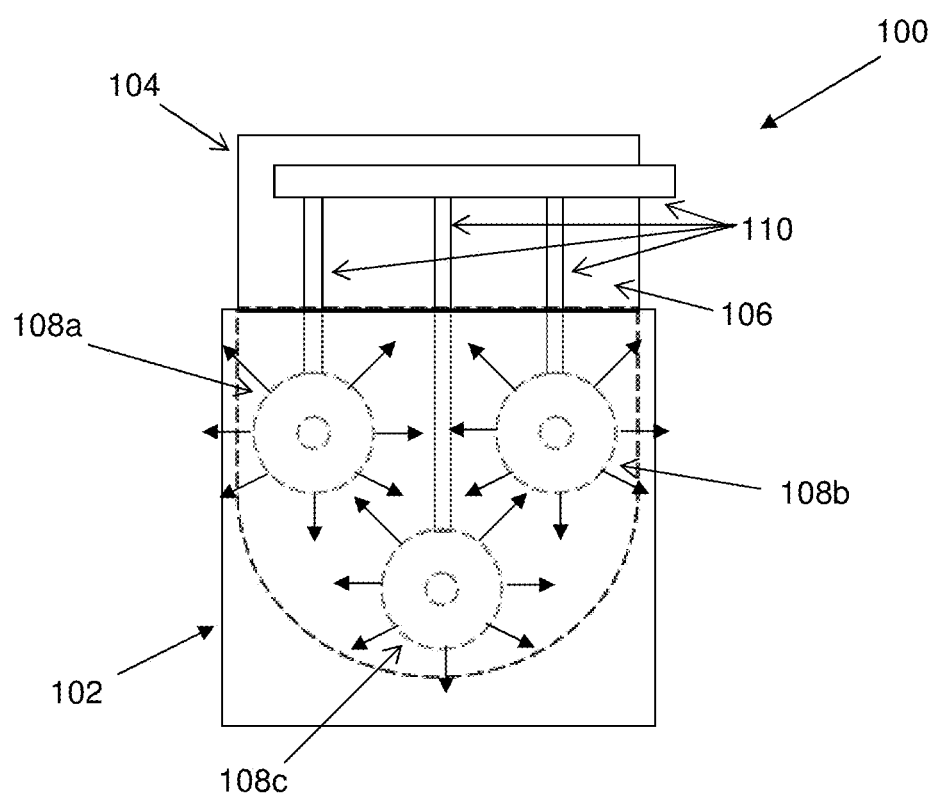
FIG. 1 shows a conventional apparatus for holding an object.
Figure 2A:
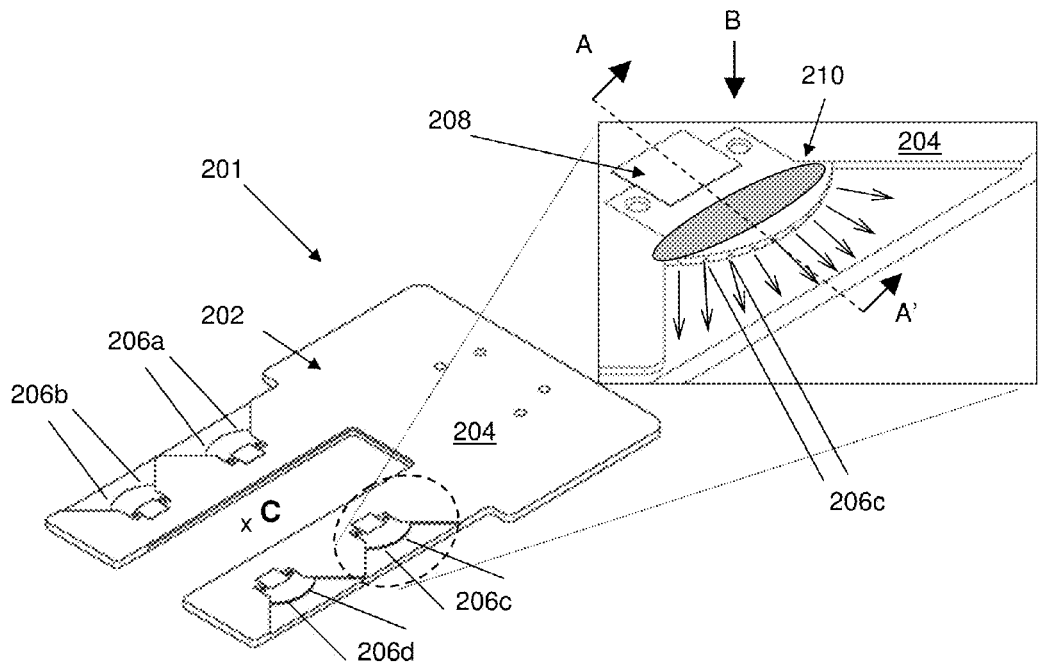

FIG. 2a shows a transfer device (shown as a picker 201) configured to hold an object according to a first preferred embodiment of this invention. The picker 201 comprises: i) a housing 202 with a housing surface 204 along which the object is held such that the object is parallel to, or aligned with, the housing surface; ii) a plurality of internal conduits 300 (see FIG. 2b) that run inside the housing 202. In particular, the plurality of conduits 300 are connected to a compressed gas pump, which supplies a gas pressure of 0.75 bar or more, to receive a gas (e.g. air) therefrom into the housing 202 through a conduit inlet 301 (see FIG. 2b). The received gas then flows along the plurality of conduits 300 before leaving the housing 202 through respective sets 206a-d of conduit outlets.

FIG. 2a also includes a magnified view of a particular set 206c of conduit outlets. It can be seen that the set 206c of conduit outlets are arranged to direct the received gas out of the housing 202 in a direction along the housing surface 204 and away from a centre region C relative to the various sets 206a-d of conduit outlets. A stopper 208 is mounted to the housing surface 204, against which the object can be rested. Specifically, the stopper 208 defines a 0.1 mm step from the housing surface 204. This means that the object is separated by a distance of 0.1 mm from the housing surface 204, as the object is being held against the stopper 208. A laminar gas flow that flows between the housing surface 204 and an opposing surface of the object accordingly generates a pressure differential to create a vacuum region 210. Effectively, the gas that flows from the various sets 206a-d of conduit outlets creates a force towards the centre region C which holds the object against the housing surface 204.

It can also be seen that the set of conduit outlets 206c are arranged along an arc of 90 degrees, such that the gas is directed out of the housing through a span of 90 degrees along the housing surface 204. Indeed, it should be appreciated that other arcs (e.g. 60 degrees, 80 degrees, 120 degrees) may also be acceptable. It should be appreciated that the above description also applies to the other sets of conduit outlets 206a, 206b, 206d. It should be also appreciated that other gases (besides air) may be used for the purpose of generating a force towards the housing surface 204 to hold the object along the housing surface 204. Examples of other gases include argon, helium, and dry nitrogen.

Figure 2B:
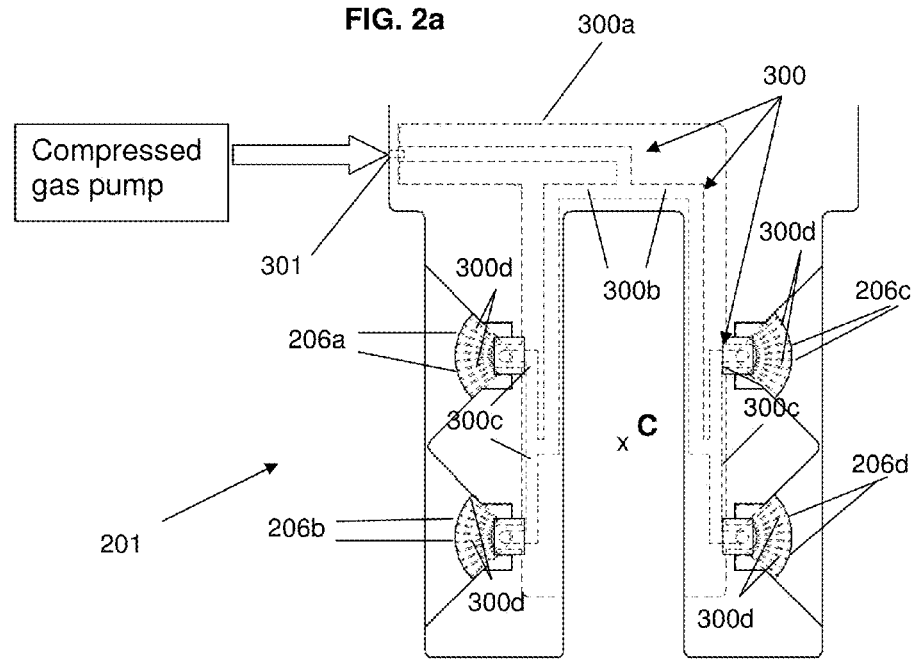

The arrangement of the conduits 300 inside the housing 202 can be seen from a side view of the picker 201, as shown in FIG. 2b. Specifically, the plurality of conduits 300 within the housing 202 of the picker 201 include a primary inlet conduit 300a, secondary first inlet conduits 300b, secondary second inlet conduits 300c, and outlet conduits 300d comprising the respective sets 206a-d of conduit outlets. The conduit inlet 301 is arranged at one end of the primary inlet conduit 300a to receive the gas from the compressed gas pump into the housing 202. The primary inlet conduit 300a branches at its opposite end to form the secondary first inlet conduits 300b. Similarly, each of the secondary first inlet conduits 300b further branches to form the secondary second inlet conduits 300c. Finally, each of the secondary second inlet conduits 300c branches into the outlet conduits 300a-d comprising the respective sets 206a-d of conduit outlets.

Figure 3A:
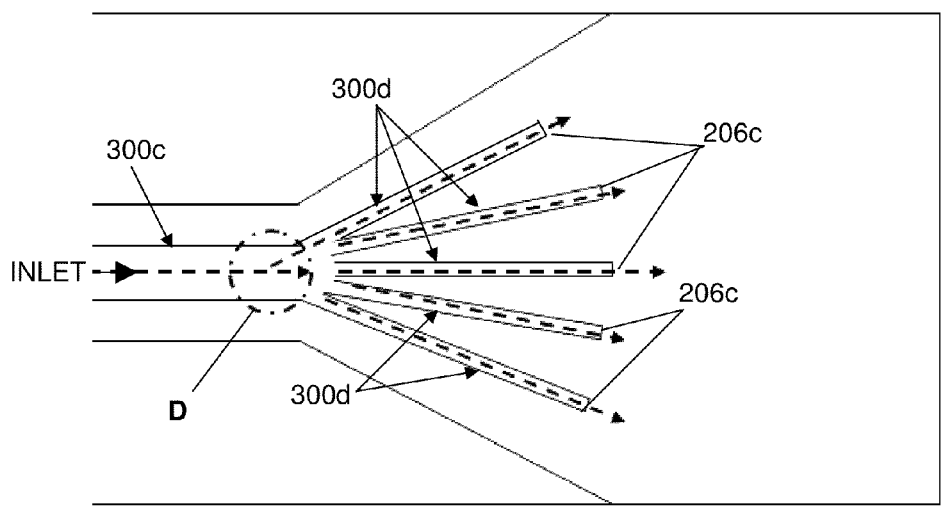
Figure 3B:
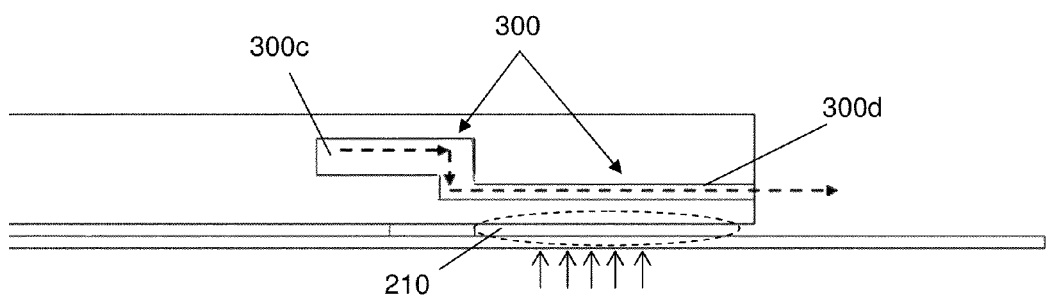

FIG. 3a is a cross-sectional view of the set 206c of conduit outlets as viewed from direction B shown in FIG. 2a, while FIG. 3b is another cross-sectional view of the set 206c of conduit outlets as viewed along line A-A'.

From FIG. 3a, it can be seen that one of the secondary second inlet conduits 300c branches at portion D into the outlet conduits 300d, such that the outlet conduits 300d are in fluid communication with the secondary second inlet conduit 300c. It should be appreciated that the secondary second inlet conduit 300c may also branch into a plurality of further secondary inlet conduits, before each further secondary inlet conduit eventually branches to form the outlet conduits 300d. Moreover, although the outlet conduits 300d are shown to be radially arranged with respect to the secondary second inlet conduit 300c, it should be appreciated that the outlet conduits may also be arranged in parallel such that the set 206c of conduit outlets are arranged along a line.

From FIG. 3b, it can be seen that the secondary second inlet conduit 300c comprises an internal volume that is larger than that of each of the outlet conduits 300d. This ensures that the gas flows at a higher speed along the outlet conduits 300d than along the inlet conduit 300c, so as to generate a larger pressure differential along the housing surface 204. This thereby translates to a correspondingly larger force created at the vacuum region 210 to hold the object along the housing surface 204 of the picker 201.

Figure 4:
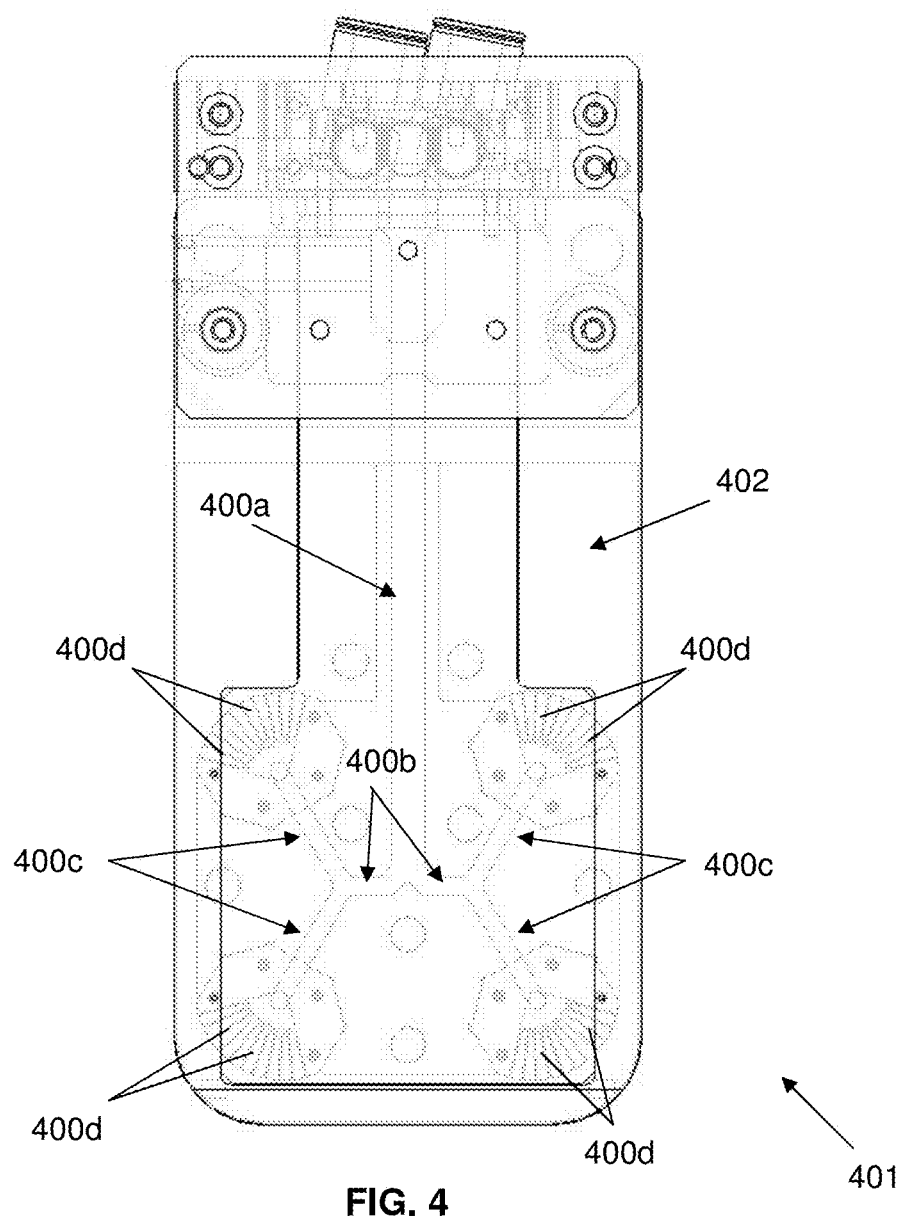
FIG. 4 shows another transfer device according to a second preferred embodiment of the invention.

FIG. 4 shows a different picker 401 according to a second preferred embodiment of this invention, which is substantially similar in structure to the picker 201. For the purpose of illustration, the arrangement of the internal conduits within the picker 401 has been purposely shown.

Like the picker 201 according to the first preferred embodiment, the picker 401 according to the second preferred embodiment comprises a housing 402, as well as a plurality of conduits 400 (comprising a primary inlet conduit 400a, secondary first inlet conduits 400b, secondary second inlet conduits 400c and outlet conduits 400d). An object can be held along a housing surface of the housing 402 where the outlets of the outlet conduits 400d are located—this housing surface is the side of the housing 402 that is opposite to the side of the housing 402 as shown in FIG. 4. In contrast to the picker 201 of the first embodiment, it can be seen that the secondary second inlet conduits 400c of the picker 401 are arranged to branch in more directions with respect to the housing surface 204, than the mere upward and downward directions of the secondary inlet conduits 300c of the picker 201 according to the first preferred embodiment of the invention.

Figure 5A:
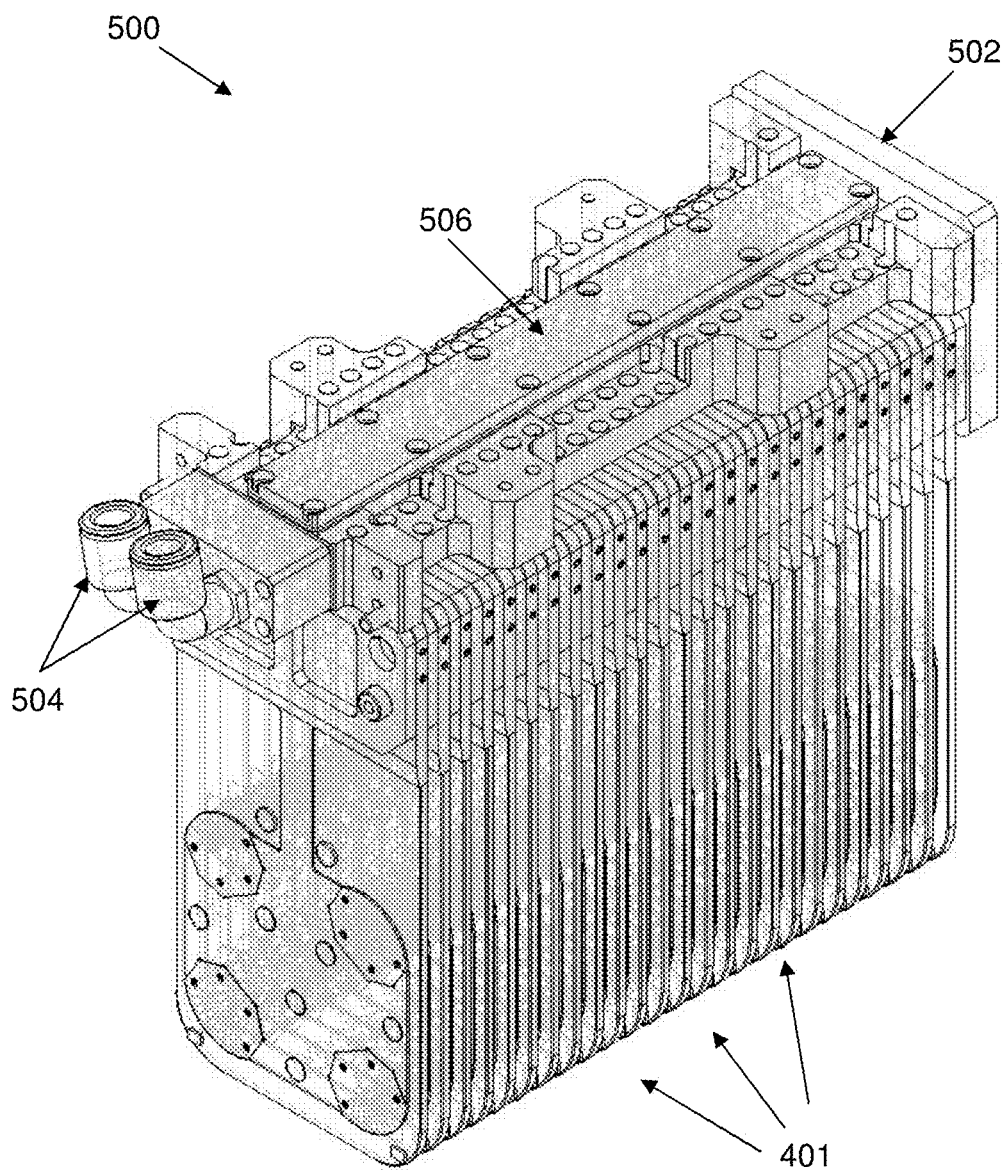

FIG. 5a shows a perspective view of a gang picker 500 for holding a plurality of objects. Specifically, the gang picker 500 comprises: i) a manifold 502; and ii) a plurality of the pickers 401 connected to the manifold 502. The manifold 502 includes two manifold inlets 504, which are connected to a compressed gas pump to receive a gas into the manifold 502. The received gas then flows through the manifold inlets 504 into the manifold 502, and subsequently, into the respective housings 402 of the pickers 401 via the conduit inlets of the primary inlet conduits 400a. In particular, the manifold 502 includes a plate 506 which provides a sealed enclosure between the manifold inlets 504 and manifold outlets 508 (see FIG. 5b), to at least reduce the likelihood of the received gas escaping from the manifold 502 and ensure that the gas exits only from the conduit outlets of the pickers 401. It should, of course, be appreciated that the manifold 502 may comprise any number of the manifold inlet 504.

Figure 5B:
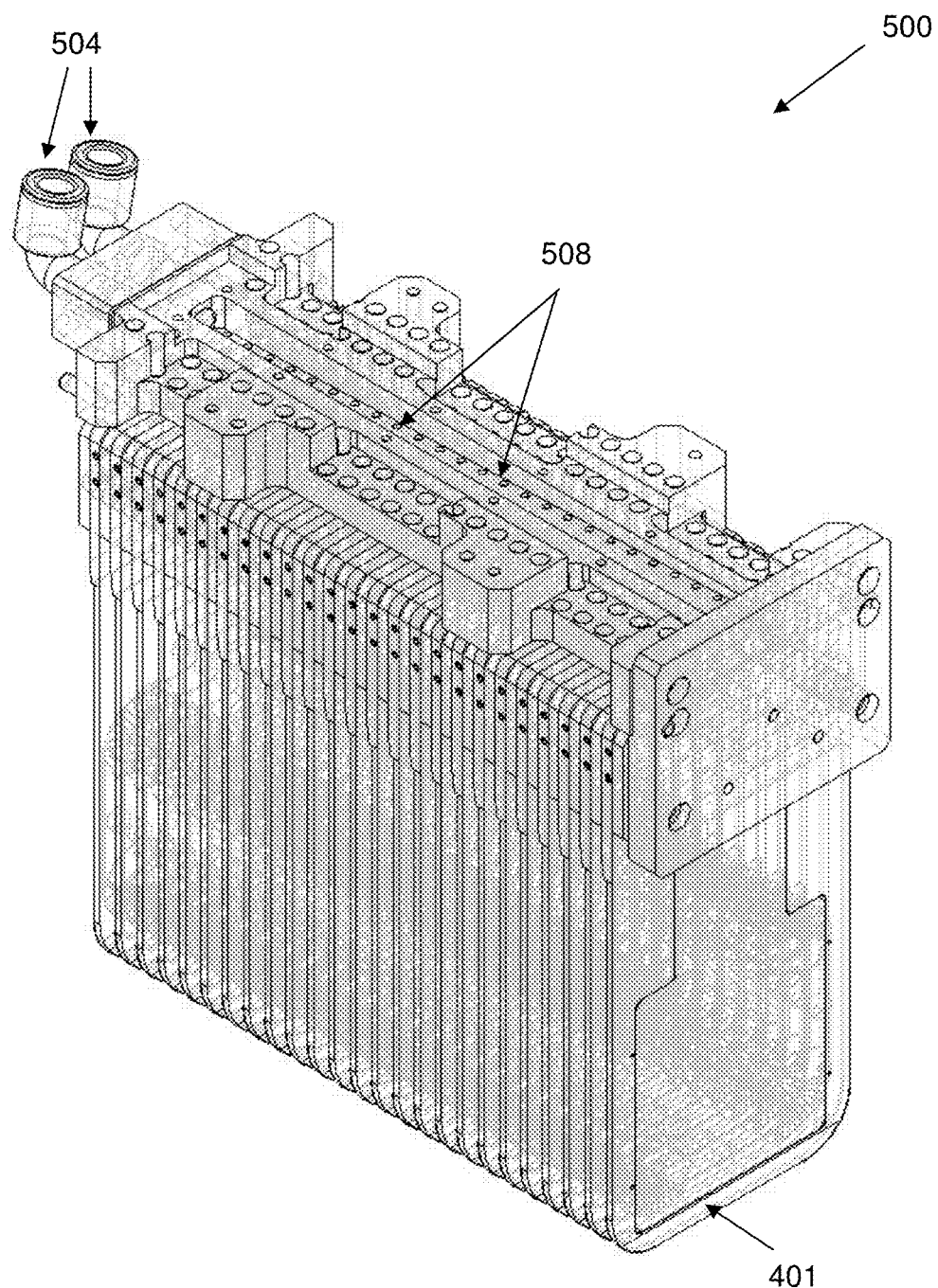

FIG. 5b shows another perspective view of the gang picker 500, but with the plate 506 removed to show the manifold outlets 508 that are connected to respective inlet conduits 400a of the pickers 401. It can be seen that the manifold outlets 508 are arranged at different levels or heights relative to a top surface of the manifold 502, with the manifold outlet 508 nearest to the gas inlets 504 arranged at a lowest level and the manifold outlet 508 farthest from the gas inlets 504 arranged at a highest level. Such an arrangement of the manifold outlets 508 ensures an even distribution of gas pressure to the pickers 401. If the manifold outlets 508 were all at equal levels or heights, there would be a much higher gas pressure at the manifold outlet 508 nearest to the manifold inlets 504 compared with that at the manifold outlet 508 farthest away from the manifold inlets 504. Consequently, the picker 401 that is closer to the gas inlets 504 would have a larger holding force compared with that farther away from the gas inlets 504. This would be undesirable.

Figure 5C:
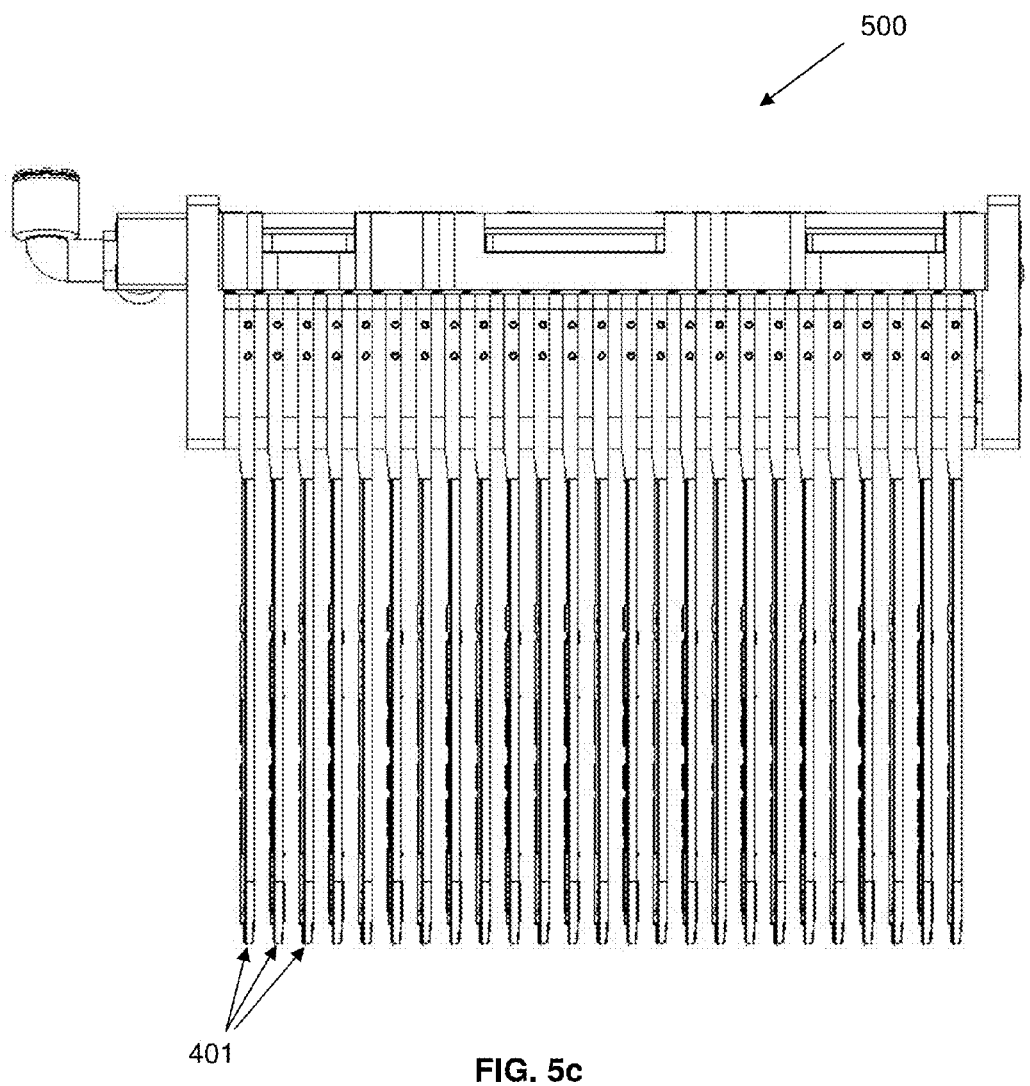
FIG. 5c is a side view of the gang picker.

FIG. 5c is a side view of the gang picker 500.

It can be seen that the thinness of each of the pickers 401 advantageously allows the gang picker 500 to slot the pickers 401 in-between gaps of a storage unit containing objects to be picked up for transfer. The thinness of the pickers 401 can be attributable to the novel arrangement of the internal conduits that run inside the respective housings 402 of the pickers 401. For instance, the thickness of each picker 401 may be about 4.3 mm—this is much reduced than the thickness of conventional pickers which are about 6 mm, or more. Furthermore, by arranging the conduit outlets to direct gas out of each picker 401 in a direction away from a centre region relative to the conduit outlets, gas turbulence that may occur at the centre region (as is the case in conventional pickers) can be prevented or at least minimised. Advantageously thus, the picker 401 will be more effective than conventional pickers in holding an object for transfer. Of course, such a benefit is also found in the picker 201 according to the first embodiment of the invention.

Figure 6A:
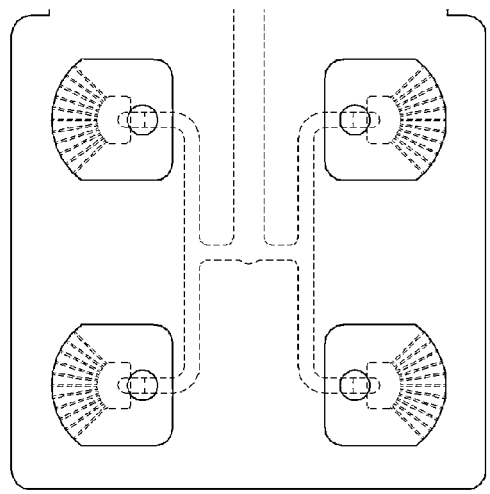
FIGS. 6a to 6d show four other transfer devices according to further preferred embodiments of the invention.
Figure 6B:
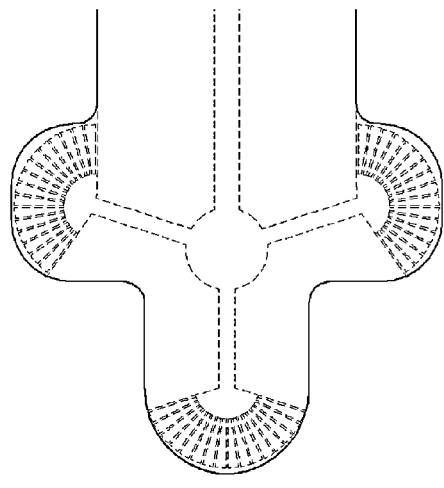
Figure 6C:
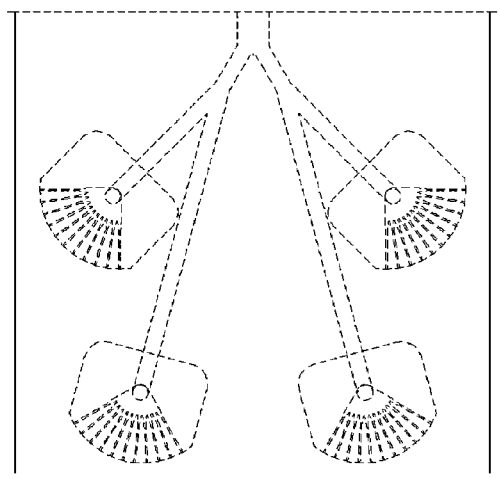
Figure 6D:
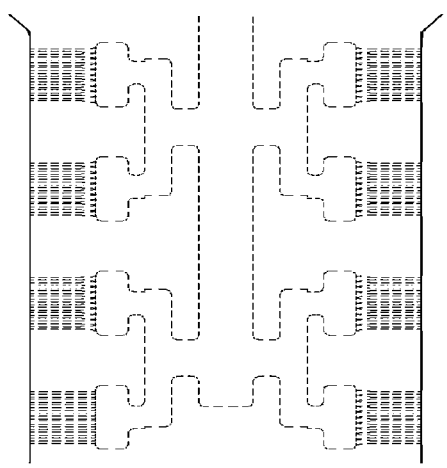

It should be appreciated that other embodiments may also be envisaged within the scope of the invention as claimed. For example, FIGS. 6a to 6d show different pickers having different arrangements of the internal conduits according to various other preferred embodiments of the invention. In particular, the arrangement of the internal conduits as shown in FIG. 6c reduces reversal of the gas that flows towards the respective outlets. This advantageously reduces pressure loss and enhances the efficiency of the biasing force that is generated to hold an object.

Figure 7:
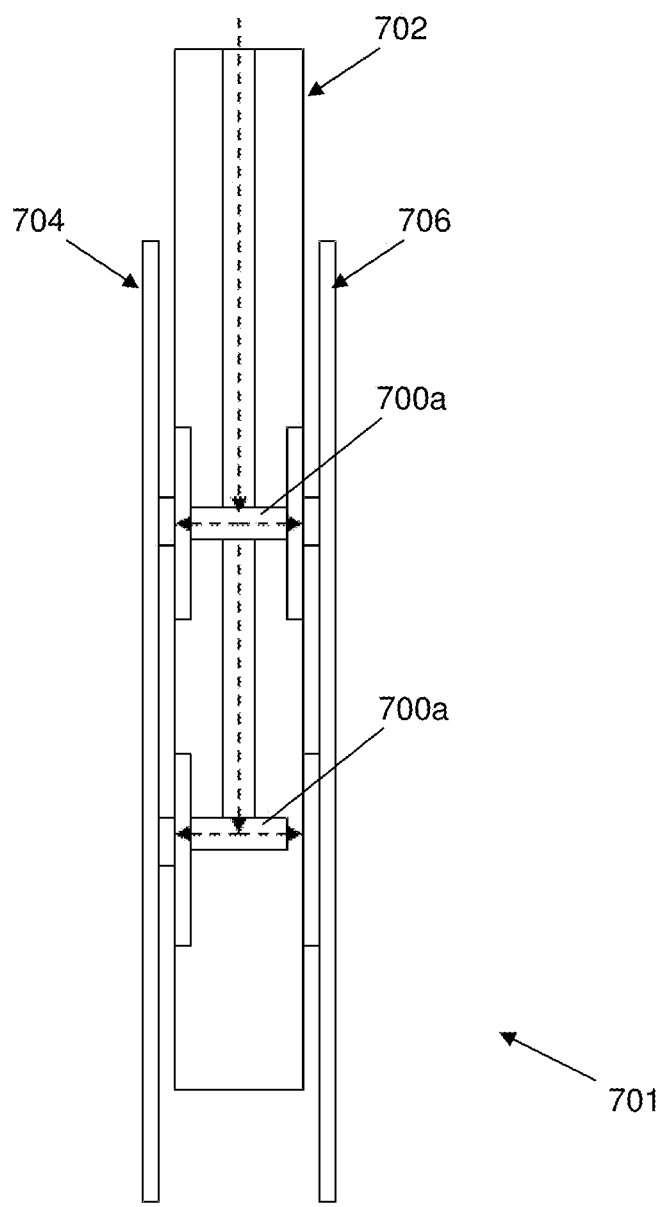
FIG. 7 shows a different transfer device that is configured to hold objects on opposite sides, according to yet another preferred embodiment of the invention.

FIG. 7 also shows another picker 701 according to yet another preferred embodiment of the invention, which is configured to hold objects 704, 706 along opposite surfaces of the picker's housing 702. In contrast to the pickers 201, 401, the inlet conduits 700a of the picker 701 branch in opposing directions towards opposite surfaces of the picker's housing 702, before eventually branching into multiple outlet conduits as described above. In other words, the picker 701 includes outlet conduits which are in fluid communication with the inlet conduits 700a, wherein the outlet conduits are arranged to direct a received gas out of the picker's housing 702 along opposing surfaces of the picker's housing 702. Although FIG. 7 shows the objects 704, 706 being vertically levelled with each other on the picker 701, it should be noted that the picker 701 may be configured such that the objects 704, 706 are mutually offset in the vertical direction. Furthermore, separate sets of inlet and outlet conduits which are not in fluid communication with each other may also be used to direct the gas along the opposite surfaces of the picker's housing 702.

Various other embodiments of the invention can also be envisaged without departing from the scope of the invention as claimed.

The invention claimed is:

1. A transfer device for holding an object, the transfer device comprising:
    a housing having a housing surface;
    at least one inlet conduit having an inlet for introducing a gas into the at least one inlet conduit;
    a plurality of secondary inlet conduits connected to the at least one inlet conduit;
    a plurality of sets of outlet conduits being in fluid communication with the at least one inlet conduit, wherein each set of outlet conduits comprises:
        a plurality of outlet conduits that branches out radially from a respective secondary inlet conduit away from a single center region relative to the plurality of sets of outlet conduits,
        wherein axes of the plurality of outlet conduits, that branches out radially from the respective secondary inlet conduit, diverge from a single point located within the housing; and
        a plurality of outlets for directing the gas out of the outlet conduits and away from the single center region relative to the plurality of sets of outlet conduits,
    wherein the respective outlets of the sets of outlet conduits are arranged in a direction along the housing surface and away from the single center region relative to the plurality of sets of outlet conduits, so that a laminar gas flow, comprising a sheet of gas, that flows out from the outlets and away from the single center region flows parallel to the housing surface such that a pressure differential is generated which creates a force towards the single center region to hold the object against the housing surface, the plurality of sets of outlet conduits are arranged parallel to the single center region, and all of the plurality of outlets direct the gas out of the outlet conduit away from the single center region.

2. The transfer device of claim 1, wherein the outlets of the respective sets of outlet conduits are circumferentially arranged with respect to the center region.

3. The transfer device of claim 1, wherein the at least one inlet conduit branches into a plurality of secondary inlet conduits, and each secondary inlet conduit further branches into a respective set of outlet conduits.

4. The transfer device of claim 3, wherein each secondary inlet conduit comprises an internal volume that is larger than each of the outlet conduits.

5. The transfer device of claim 1, wherein the outlet conduits of each set of outlet conduits are radially arranged in a direction along the housing surface.

6. The transfer device of claim 5, wherein the respective outlets of each set of outlet conduits are arranged along an arc of 90 degrees.

7. The transfer device of claim 1, wherein the single center region is bounded by parallel sides of the housing.

8. The transfer device of claim 1, wherein each of the secondary inlet conduits branches out radially from the single center region.

9. The transfer device of claim 1, further comprising a stopper mounted to the housing surface, the object being placed against the stopper, wherein the stopper defines a separation distance from the housing surface, so that the pressure differential is generated in the separation distance between the housing surface and an opposing surface of the object.

* * * * *